United States Patent
Golda et al.

(10) Patent No.: US 8,596,747 B2
(45) Date of Patent: Dec. 3, 2013

(54) MODULAR PRINTHEAD FOR OLED PRINTING

(75) Inventors: Dariusz Golda, Redwood City, CA (US); Valerie Gassend, San Carlos, CA (US); Hyeun-Su Kim, Palo Alto, CA (US)

(73) Assignee: Kateeva, Inc., Menlo Park, CA (US)

( * ) Notice: Subject to any disclaimer, the term of this patent is extended or adjusted under 35 U.S.C. 154(b) by 0 days.

(21) Appl. No.: 13/327,745

(22) Filed: Dec. 15, 2011

(65) Prior Publication Data

US 2012/0086764 A1 Apr. 12, 2012

Related U.S. Application Data

(63) Continuation-in-part of application No. 13/154,419, filed on Jun. 6, 2011, now Pat. No. 8,556,389, which is a continuation-in-part of application No. 12/139,409, filed on Jun. 13, 2008, now abandoned.

(60) Provisional application No. 61/439,816, filed on Feb. 4, 2011, provisional application No. 60/944,000, filed on Jun. 14, 2007.

(51) Int. Cl.
*B41J 2/015* (2006.01)
*B05D 5/06* (2006.01)
*H01L 21/00* (2006.01)

(52) U.S. Cl.
USPC .................................. 347/20; 427/66; 438/21

(58) Field of Classification Search
USPC ........... 347/14, 20, 85, 237; 118/302; 438/21; 427/66, 61, 287
See application file for complete search history.

(56) References Cited

U.S. PATENT DOCUMENTS

| | | |
|---|---|---|
| 4,238,807 A | 12/1980 | Bovio et al. |
| 4,751,531 A | 6/1988 | Saito et al. |
| 5,041,161 A | 8/1991 | Cooke et al. |
| 5,116,148 A | 5/1992 | Ohara et al. |
| 5,155,502 A | 10/1992 | Kimura et al. |
| 5,172,139 A | 12/1992 | Sekiya et al. |
| 5,202,659 A | 4/1993 | DeBonte et al. |

(Continued)

FOREIGN PATENT DOCUMENTS

| | | |
|---|---|---|
| EP | 1 626 103 | 2/2006 |
| JP | 06-122201 | 5/1994 |

(Continued)

OTHER PUBLICATIONS

Chen et al., "Evaporative Deposition of Molecular Organics in Ambient with a Molecular Jet Printer," *Digital Fabrication*, Sep. 2006, pp. 63-65.

(Continued)

*Primary Examiner* — Kristal Feggins

(57) ABSTRACT

The disclosure generally relates to a modular printhead configured for ease of access and quick replacement of the printhead. In one embodiment, the disclosure is directed to an integrated printhead which includes: a printhead die supporting a plurality of micropores thereon; a support structure for supporting the printhead die; a heater interposed between the printhead die and the support structure; and an electrical trace connecting the heater to a supply source. The support structure accommodates the electrical trace through a via formed within it so as to form a solid state printhead containing all of the connections within and providing easily replaceable printhead.

21 Claims, 17 Drawing Sheets

(56) References Cited

U.S. PATENT DOCUMENTS

| | | | |
|---|---|---|---|
| 5,247,190 A | 9/1993 | Friend et al. | |
| 5,405,710 A | 4/1995 | Dodabalapur et al. | |
| 5,574,485 A | 11/1996 | Anderson et al. | |
| 5,623,292 A | 4/1997 | Shrivastava et al. | |
| 5,703,436 A | 12/1997 | Forrest et al. | |
| 5,707,745 A | 1/1998 | Forrest et al. | |
| 5,731,828 A | 3/1998 | Ishinaga et al. | |
| 5,781,210 A | 7/1998 | Hirano et al. | |
| 5,801,721 A | 9/1998 | Gandy et al. | |
| 5,834,893 A | 11/1998 | Bulovic et al. | |
| 5,844,363 A | 12/1998 | Gu et al. | |
| 5,865,860 A | 2/1999 | Delnick | |
| 5,947,022 A | 9/1999 | Freeman et al. | |
| 5,956,051 A | 9/1999 | Davies et al. | |
| 6,013,982 A | 1/2000 | Thompson et al. | |
| 6,065,825 A | 5/2000 | Anagnostopoulos et al. | |
| 6,086,195 A | 7/2000 | Bohorquez et al. | |
| 6,086,196 A | 7/2000 | Ando et al. | |
| 6,086,679 A | 7/2000 | Lee et al. | |
| 6,087,196 A | 7/2000 | Sturm et al. | |
| 6,091,195 A | 7/2000 | Forrest et al. | |
| 6,095,630 A | 8/2000 | Horii et al. | |
| 6,097,147 A | 8/2000 | Baldo et al. | |
| 6,189,989 B1 | 2/2001 | Hirabayashi et al. | |
| 6,250,747 B1 | 6/2001 | Hauck | |
| 6,257,706 B1 | 7/2001 | Ahn | |
| 6,294,398 B1 | 9/2001 | Kim et al. | |
| 6,303,238 B1 | 10/2001 | Thompson et al. | |
| 6,312,083 B1 | 11/2001 | Moore | |
| 6,326,224 B1 | 12/2001 | Xu et al. | |
| 6,337,102 B1 | 1/2002 | Forrest et al. | |
| 6,431,702 B2 | 8/2002 | Ruhe | |
| 6,444,400 B1 | 9/2002 | Cloots et al. | |
| 6,453,810 B1 | 9/2002 | Rossmeisl et al. | |
| 6,460,972 B1 | 10/2002 | Trauernicht et al. | |
| 6,468,819 B1 | 10/2002 | Kim et al. | |
| 6,472,962 B1 | 10/2002 | Guo et al. | |
| 6,498,802 B1 | 12/2002 | Chu et al. | |
| 6,513,903 B2 | 2/2003 | Sharma et al. | |
| 6,548,956 B2 | 4/2003 | Forrest et al. | |
| 6,562,405 B2 | 5/2003 | Eser et al. | |
| 6,576,134 B1 | 6/2003 | Agner | |
| 6,586,763 B2 | 7/2003 | Marks et al. | |
| 6,601,936 B2 | 8/2003 | McDonald | |
| 6,666,548 B1 | 12/2003 | Sadasivan et al. | |
| 6,811,896 B2 | 11/2004 | Aziz et al. | |
| 6,824,262 B2 | 11/2004 | Kubota et al. | |
| 6,861,800 B2 | 3/2005 | Tyan et al. | |
| 6,871,942 B2 | 3/2005 | Emery et al. | |
| 6,896,346 B2 | 5/2005 | Trauernicht et al. | |
| 6,911,671 B2 | 6/2005 | Marcus et al. | |
| 6,917,159 B2 | 7/2005 | Tyan et al. | |
| 6,982,005 B2 | 1/2006 | Eser et al. | |
| 7,023,013 B2 | 4/2006 | Ricks et al. | |
| 7,077,513 B2 | 7/2006 | Kimura et al. | |
| 7,247,394 B2 | 7/2007 | Hatwar et al. | |
| 7,374,984 B2 | 5/2008 | Hoffman | |
| 7,377,616 B2 | 5/2008 | Sakurai | |
| 7,404,862 B2 | 7/2008 | Shtein et al. | |
| 7,406,761 B2 | 8/2008 | Jafri et al. | |
| 7,410,240 B2 | 8/2008 | Kadomatsu et al. | |
| 7,431,435 B2 | 10/2008 | Lopez et al. | |
| 7,431,968 B1 | 10/2008 | Shtein et al. | |
| 7,530,778 B2 | 5/2009 | Yassour et al. | |
| 7,603,028 B2 | 10/2009 | Yassour et al. | |
| 7,648,230 B2 | 1/2010 | Kachi | |
| 7,677,690 B2 | 3/2010 | Takatsuka | |
| 7,802,537 B2 | 9/2010 | Kang | |
| 7,857,121 B2 | 12/2010 | Yassour | |
| 7,883,832 B2 | 2/2011 | Colburn et al. | |
| 7,908,885 B2 | 3/2011 | Devitt | |
| 8,128,753 B2 | 3/2012 | Bulovic et al. | |
| 8,383,202 B2 * | 2/2013 | Somekh et al. | 427/261 |
| 2001/0045973 A1 | 11/2001 | Sharma et al. | |
| 2002/0008732 A1 | 1/2002 | Moon et al. | |
| 2002/0191063 A1 | 12/2002 | Gelbart et al. | |
| 2003/0000476 A1 | 1/2003 | Matsunaga et al. | |
| 2003/0175414 A1 | 9/2003 | Hayashi | |
| 2003/0230980 A1 | 12/2003 | Forrest et al. | |
| 2004/0009304 A1 | 1/2004 | Pichler | |
| 2004/0048000 A1 | 3/2004 | Shtein et al. | |
| 2004/0048183 A1 | 3/2004 | Teshima | |
| 2004/0056244 A1 | 3/2004 | Marcus et al. | |
| 2004/0086631 A1 | 5/2004 | Han | |
| 2004/0174116 A1 | 9/2004 | Lu et al. | |
| 2004/0202794 A1 | 10/2004 | Yoshida | |
| 2005/0005850 A1 | 1/2005 | Yamazaki et al. | |
| 2005/0190220 A1 | 9/2005 | Lim et al. | |
| 2005/0223994 A1 | 10/2005 | Blomiley et al. | |
| 2006/0012290 A1 | 1/2006 | Kang | |
| 2006/0115585 A1 | 6/2006 | Bulovic et al. | |
| 2006/0159842 A1 * | 7/2006 | Gupta et al. | 427/66 |
| 2006/0203078 A1 * | 9/2006 | Naugler et al. | 347/237 |
| 2007/0040877 A1 | 2/2007 | Kachi | |
| 2007/0058010 A1 | 3/2007 | Nagashima | |
| 2007/0134512 A1 | 6/2007 | Klubek et al. | |
| 2007/0286944 A1 | 12/2007 | Yokoyama et al. | |
| 2008/0098891 A1 | 5/2008 | Tyan et al. | |
| 2008/0174235 A1 | 7/2008 | Kim et al. | |
| 2008/0238310 A1 | 10/2008 | Forrest et al. | |
| 2008/0299311 A1 | 12/2008 | Shtein et al. | |
| 2008/0308037 A1 | 12/2008 | Bulovic et al. | |
| 2008/0309731 A1 | 12/2008 | Saito et al. | |
| 2008/0311289 A1 | 12/2008 | Bulovic et al. | |
| 2008/0311296 A1 | 12/2008 | Shtein et al. | |
| 2008/0311307 A1 | 12/2008 | Bulovic et al. | |
| 2009/0031579 A1 | 2/2009 | Piatt et al. | |
| 2009/0045739 A1 | 2/2009 | Kho et al. | |
| 2009/0115706 A1 | 5/2009 | Hwang et al. | |
| 2009/0167162 A1 | 7/2009 | Lin et al. | |
| 2009/0220680 A1 | 9/2009 | Winters | |
| 2010/0055810 A1 | 3/2010 | Sung et al. | |
| 2010/0079513 A1 | 4/2010 | Taira et al. | |
| 2010/0171780 A1 | 7/2010 | Madigan et al. | |
| 2010/0188457 A1 | 7/2010 | Madigan et al. | |
| 2010/0201749 A1 | 8/2010 | Somekh et al. | |
| 2010/0310424 A1 | 12/2010 | Rose et al. | |
| 2011/0008541 A1 | 1/2011 | Madigan et al. | |
| 2011/0057171 A1 | 3/2011 | Adamovich et al. | |
| 2011/0181644 A1 | 7/2011 | Bulovic et al. | |
| 2011/0267390 A1 | 11/2011 | Bulovic et al. | |
| 2011/0293818 A1 | 12/2011 | Madigan et al. | |
| 2012/0038705 A1 * | 2/2012 | Madigan et al. | 347/20 |
| 2012/0076925 A1 * | 3/2012 | Bulovic et al. | 427/66 |

FOREIGN PATENT DOCUMENTS

| | | |
|---|---|---|
| JP | 08-216401 | 8/1996 |
| JP | 09-248918 | 9/1997 |
| JP | 11-320873 | 11/1999 |
| JP | 2002-069650 | 3/2002 |
| JP | 2005-286069 | 10/2005 |
| JP | 2005-288705 | 10/2005 |
| JP | 2006-123551 | 5/2006 |
| JP | 2006-150900 | 6/2006 |
| JP | 2007-076168 | 3/2007 |
| JP | 2007-095343 | 4/2007 |
| JP | 2007-299616 | 11/2007 |
| JP | 2008-000977 | 1/2008 |
| JP | 2008-2215857 | 9/2008 |
| JP | 05-255630 | 10/2009 |
| JP | 2010-143116 | 7/2010 |
| KR | 100232852 | 12/1999 |
| KR | 10-2005-0072523 | 7/2005 |
| KR | 10-2008-0060111 | 7/2007 |
| WO | WO 2005/090085 | 9/2005 |

OTHER PUBLICATIONS

Chen et al., "Ambient Environment Patterning of Organic Thin Films by a Second Generation molecular Jet (MoJet) Printer," *Progress Report 2006-2007*, Oct. 2007, pp. 26-6; 26-7.

(56) References Cited

OTHER PUBLICATIONS

Street et al., "Jet Printing of Active-Matrix TFT Backplanes for Displays and Sensors", IS&T Archiving, Dec. 2005, vol. 20, No. 5, 16 pages.

Chin, Byung Doo, "Effective Hole Transport Layer Structure for Top Emitting Devices Based on Laser Transfer Patterning," *Journal of Physics D: Applied Physics*, 2007, vol. 40, pp. 5541-5546.

Elwenspoek et al., "Silicon Micromachining," Aug. 2004, Cambridge University, Cambridge, U.K. ISBN 0521607671. [Abstract].

Forrest, Stephen R., "The Path to Ubiquitous and Low-cost Organic Electronic Appliances on Plastic," Nature, Apr. 29, 2004, vol. 428, 8 pages.

C. Ducso, et al. "Porous Silicon Bulk Micromachining for Thermally Isolated Membrane Formation," *Sensors and Actuators A*, 1997, vol. 60, pp. 235-239.

C. Tsamis, et al. "Thermal Properties of Suspended Porous Micro-hotplates for Sensor Applications," *Sensor and Actuators B*, 2003, vol. 95, pp. 78-82.

J. Lee, et al. "Differential Scanning Calorimeter Based on Suspended Membrane Single Crystal Silicon Microhotplate," *Journal of Microelectromechanical Systems*, Dec. 2008, vol. 17, No. 6, pp. 1513-1525.

Leblanc et al., "Micromachined Printheads for the Evaporative Patterning of Organic Materials and Metals," Journal of Microelectromechanical Systems, Apr. 2007, vol. 16, No. 2, 7 pp. 1-139.

Lindermann et al., "Thermal Bubble Jet Printhead with Integrated Nozzle Plate," NIP20: International Conference on Digital Printing Technologies, Oct. 2004, pp. 834-839.

J. C. Belmonte, et al. "High-temperature Low-power Performing Micromachined Suspended Micro-hotplate for Gas Sensing Applications<" *Sensors and Actuators B*, 2006, vol. 114, pp. 826-835.

G.S. Chung, "Fabrication and Characterization of Micro-heaters with Low-power Consumption using SOI membrane and Trench Structures," *Sensors and Actuators A*, 2004, vol. 112, pp. 55-60.

Geffroy et al., "Organic Light-emitting Diode (OLED) Technology: Material Devices and Display Technologies," *Polymer International*, Jun. 2006, vol. 55, pp. 572-582. (Abstract only).

Huang et al., "Reducing Blueshift of Viewing Angle for Top-Eimtting Organic Light-Emitting Devices," Dec. 6, 2008, 3 pages.

J. Lee, et al. "Cavity Effects on Light Extraction in Organic Light emitting Devices," *Applied Physics Letters*, Jan. 24, 2008, vol. 92, No. 3, 5 pages.

S.H. Kim et al. "Fabrication and Characterization of co-planar type MEMS Structures on SiO2/Si3N4 Membrane for Gas Sensors with Dispensing Method Guided by Micromachined Wells," Journal of Eletroceramics, Jun. 27, 2005, vol. 17, No. 2-4, pp. 995-998.

Chen, Jianglong, "Novel Patterning Techniques for Manufacturing Organic and Nanostructured Electronics," M.S. Materials Science and Engineering, Massachusetts Institute of Technology, 2003, pp. 1-206.

Chen, Jingkuang et al., "A High-Resolution Silicon Monolithic Nozzle Array for Inkjet Printing," IEEE Transactions on Electron Devices, vol. 44, No. 9, Sep. 1997, pp. 1401-1409.

International Search Report issued on Dec. 15, 2010 for PCT Application No. PCT/US10/020144.

International Search Report issued on Sep. 2, 2010 for PCT Application No. PCT/US10/033315.

International Search Report and Written Opinion issued on Mar. 24, 2011 for PCT Application No. PCT/US10/058145.

International Preliminary Report on Patentability issued on Dec. 17, 2009 for PCT Application No. PCT/US08/66975.

International Preliminary Report on Patentability issued on Dec. 7, 2009 for PCT Application No. PCT/US08/066991.

International Preliminary Report on Patentability issued on Dec. 17, 2009 for PCT Application No. PCT/US08/67002.

International Search Report and Written Opinion issued on Sep. 25, 2012 for PCT Application No. PCT/US12/023862.

International Search Report and Written Opinion issued on Sep. 3, 2012 for PCT Application No. PCT/US11/065306.

Non-Final Office Action issued to U.S. Appl. No. 13/154,419, on Jul. 8, 2013.

* cited by examiner

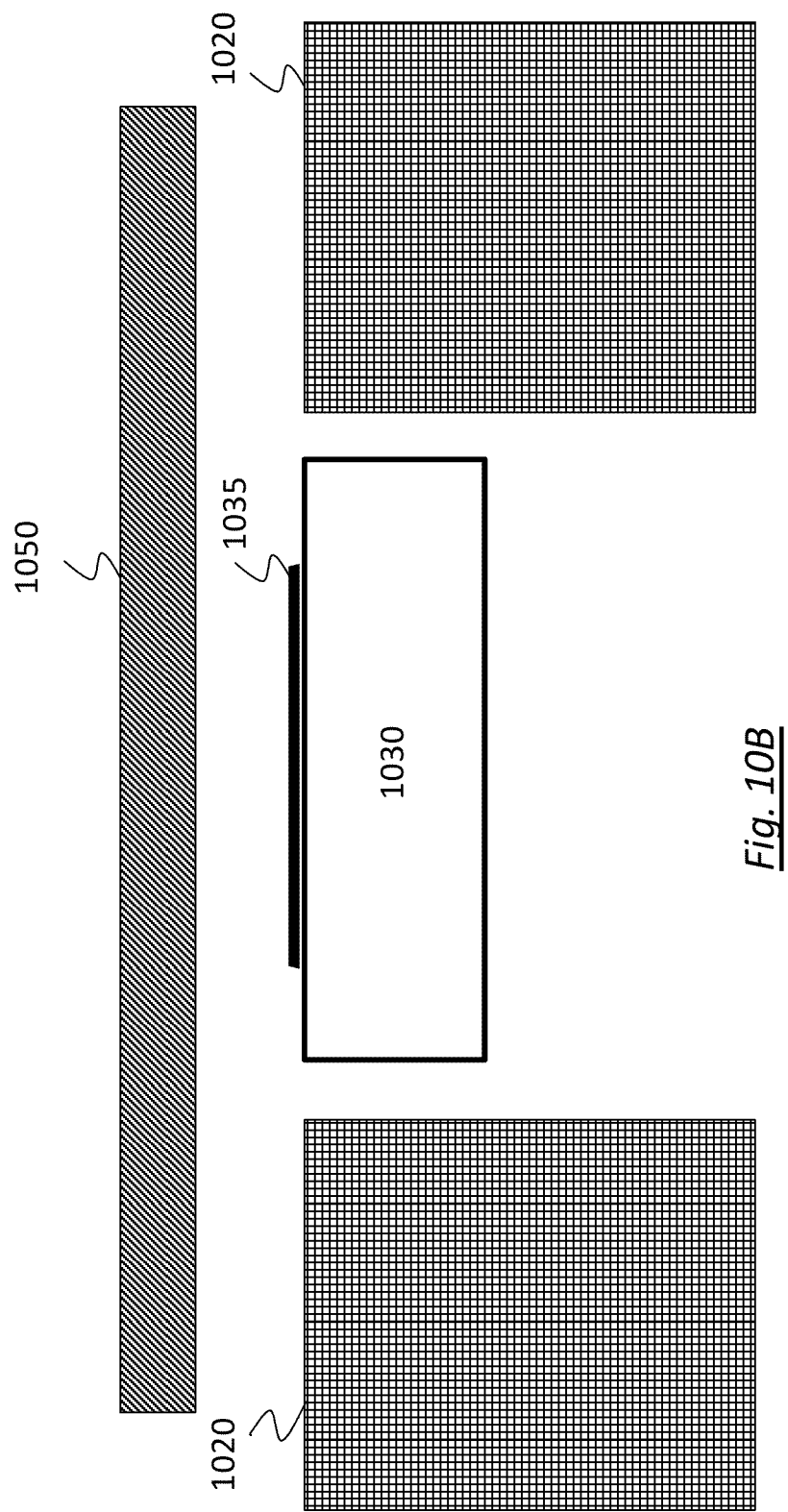

MODULAR PRINTHEAD FOR OLED PRINTING

CROSS-REFERENCE TO RELATED APPLICATIONS

The instant application claims the benefit of U.S. Provisional Application No. 61/439,816, filed Feb. 5, 2011. The instant application is a continuation-in-part of U.S. application Ser. No. 13/154,419, filed Jun. 6, 2011, which claims the benefit of U.S. Provisional Application No. 61/439,816, filed Feb. 5, 2011. The instant application is a continuation-in-part of U.S. application Ser. No. 12/139,409, filed Jun. 13, 2008, which claims the benefit of U.S. Provisional Application No. 60/944,000, filed Jun. 16, 2007. The disclosure of all the identified applications are incorporated herein in their entirety.

BACKGROUND

1. Field of the Invention

The disclosure relates to printheads for evaporative printing of materials for organic light emitting device or diode (OLED). More specifically, the disclosure relates to a MEMS printhead fabricated from silicon material and assembled using backside support structure so as to define a modular printhead for ease of construction, attachment and assembly.

2. Description of Related Art

Organic optoelectronic devices, such as organic light emitting diodes (OLEDs) used for flat-panel displays, are fabricated by depositing layers of organic film onto a target substrate and coupling the top and bottom of the film stack to electrodes. Using advanced techniques, film layer thicknesses on the order of 100 nanometers can be achieved.

One such technique deposits OLED film layers onto substrate by thermal evaporation of the organic material from a thermal printhead. The organic ink material is first dissolved in a liquid carrier to form a liquid ink. The ink is transferred to the printhead, and the target substrate and printhead are drawn into close proximity. The ink is then heated in stages. The first stage evaporates the solvent. During the second stage, the ink is heated rapidly above its sublimation temperature until the organic ink materials evaporate to cause condensation of the organic vapor onto the target substrate. The process may be repeated until a desired film layer thickness is achieved. The composition of ink may be varied to achieve different colors and to optimize other properties such as viscosity and sublimation temperature.

In printing such films it also is important to deposit a dry film onto a surface so that the material being deposited forms a substantially solid film upon contact with the substrate. The solid film must have a uniform thickness. This is in contrast with ink printing where wet ink is deposited onto the surface and the ink then dries to form a solid film. Because ink printing deposits a wet film, it is commonly referred to as a wet printing method.

Wet printing methods have several significant disadvantages. First, as ink dries, the solid content of the ink may not be deposited uniformly over the deposited area. That is, as the solvent evaporates, the film uniformity and thickness varies substantially. For applications requiring precise uniformity and film thickness, such variations in uniformity and thickness are not acceptable. Second, the wet ink may interact with the underlying substrate. The interaction is particularly problematic when the underlying substrate is pre-coated with a delicate film. Finally, the surface of the printed film can be uneven. An application in which these problems are resolved is critical to OLED deposition.

The problem with wet printing can be partially resolved by using a dry transfer printing technique. In transfer printing techniques in general, the material to be deposited is first coated onto a transfer sheet and then the sheet is brought into contact with the surface onto which the material is to be transferred. This is the principle behind dye sublimation printing, in which dyes are sublimated from a ribbon in contact with the surface onto which the material will be transferred. This is also the principle behind carbon paper. However, the dry printing approach introduces new problems. Because contact is required between the transfer sheet and the target surface, if the target surface is delicate it may be damaged by contact. Furthermore, the transfer may be negatively impacted by the presence of small quantities of particles on either the transfer sheet or the target surface. Such particles will create a region of poor contact that impedes transfer.

The particle problem is especially acute in cases where the transfer region consists of a large area, as is typically employed in the processing of large area electronics such as flat panel televisions. In addition, conventional dry transfer techniques utilize only a portion of the material on the transfer medium, resulting in low material utilization and significant waste. Film material utilization is important when the film material is very expensive.

In addition, high resolution OLED displays may require pixel characteristic dimensions on the order of 100 microns or less. To achieve this degree of quality control, the printhead gap, that is, the gap between the printhead and the target substrate should be specified on an order of magnitude commensurate with the desired pixel characteristic dimensions. MEMS technology has been proposed for fabricating thermal printheads for evaporative deposition having this level of precision. One of the problems to be solved with this approach, and which is addressed by the present disclosure, is how to deliver thermal energy to the printing surface of a MEMS thermal printhead while enabling a sufficiently small print gap.

SUMMARY

The disclosure generally relates to a modular printhead configured for print gaps less than 50 micrometers. In one embodiment, the disclosure is directed to an integrated printhead, comprising: a printhead die supporting a plurality of micropores thereon; a support structure for supporting the printhead die; a heater interposed between the printhead die and the support structure; and an electrical trace connecting the heater to a supply source. The support structure accommodates the electrical trace through an electrical via formed within it so as to form a solid state printhead containing all of the connections within and providing easily replaceable printhead.

A method for constructing a printhead comprises the steps of: forming a plurality of micropores on a distal surface of a printhead die; forming a heater on the proximal surface of the printhead die; forming at least one electrical trace on a support structure; and connecting the support structure to one of the electrical heater or the printhead die through a connection joint. The support structure provides a solid state connection between an electrical supply source and the heater and wherein the connection joint provides a path for said connection. The printhead can define an integrated, solid state, device.

Another embodiment of the disclosure relates to a printhead module for printing OLED material. The printhead includes a printhead die having a proximal surface and a distal surface, the distal surface defining a plurality of micropores. A heater is in thermal communication with the proximal surface of the printhead die. A support structure is also provided to receive and support and the printhead die. The support structure provides a trace for connecting the heater to a supply source. The printhead die in combination with the heater and the support structure form a printhead. In one embodiment, the distal surface of the printhead die defines a flatness tolerance of less than 20 micron.

BRIEF DESCRIPTION OF THE DRAWINGS

These and other embodiments of the disclosure will be discussed with reference to the following exemplary and non-limiting illustrations, in which like elements are numbered similarly, and where:

FIGS. 10A-10C schematically represent printing an OLED film according to one embodiment of the disclosure.

DETAILED DESCRIPTION

Application of OLED material requires producing substantially flat OLED layers on the substrate. Variation in thickness can result in undesirable outcomes and post-manufacturing failures.

Figure 1:
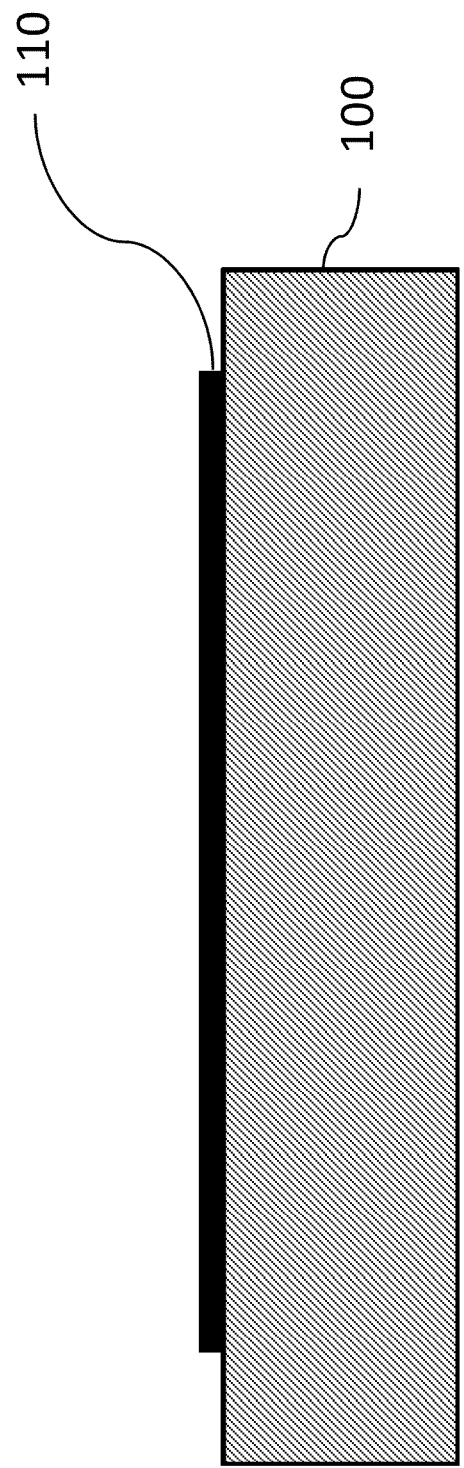
FIG. 1 schematically shows a substrate containing an OLED film.

FIG. 1 schematically shows a substrate supporting an OLED film. Specifically, FIG. 1 shows substrate 100 having OLED film 110 thereon. As stated, it is desired to deposit the OLED film with a uniform thickness. In the schematic representation of FIG. 1, OLED film 110 has a flat surface.

Figure 2:
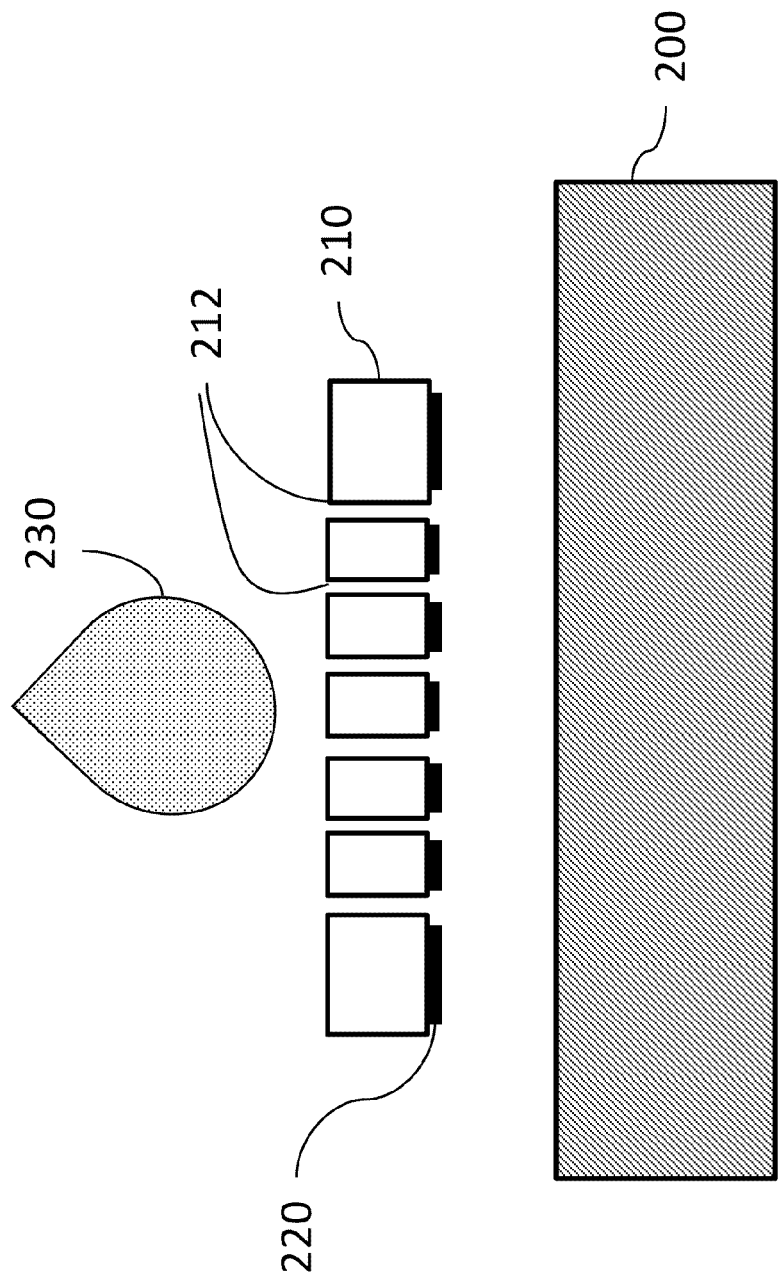
FIG. 2 is a schematic representation of a conventional open printhead.

FIG. 2 is a schematic representation of a conventional OLED printhead. The OLED Printhead 210 of FIG. 2 is positioned over substrate 200. Printhead 210 receives OLED material 230 in liquid form. In one embodiment, OLED material 230 is defined by solid OLED particles which are suspended and/or dissolved in a carrier liquid. Conventional carrier liquids include solvents that may have low vapor pressure.

Figure 3:
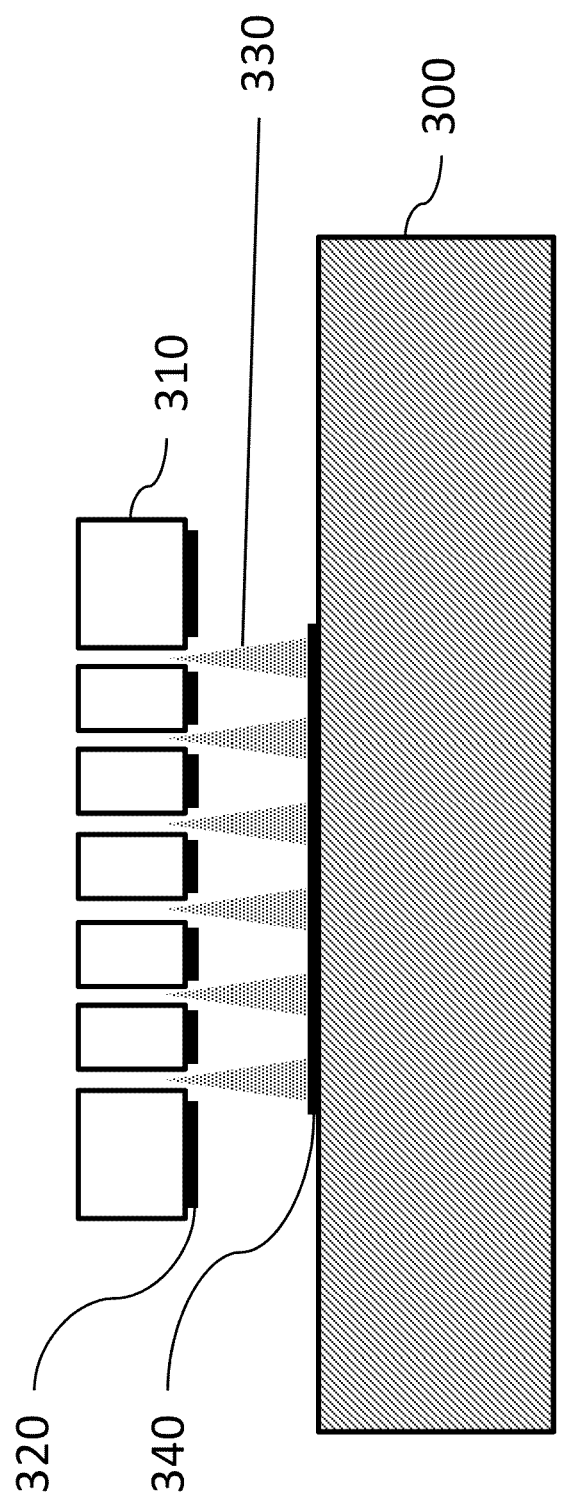
FIG. 3 schematically shows OLED printing using a conventional open printhead.

Printhead 210 may include one or more resistive heaters. In FIG. 2, resistive heaters 220 are shown on the distal surface of printhead 210. While the schematic representation of FIG. 2 shows resistive elements 220 on the distal (bottom) surface of printhead 210, it is possible to place the heater on the proximal (top) surface. It is also possible to include resistive heaters on both the proximal and the distal surfaces of the printhead. In an operative embodiment, liquid material 230 is received at the proximal surface of printhead 210 and is drawn into micropores 212. Resistive heaters 220 remove substantially all the carrier fluid from OLED material 230 and evaporate the solid OLED material prior to dispensing. This process is schematically shown in FIG. 3 where OLED vapor 330 is dispensed from printhead 310. The OLED particles can be vaporized prior to dispensing. The sublimated particles are received at substrate 300 which is cooler than the distal surface of printhead 310 (and heaters 320). The difference in temperature causes OLED material 330 to condense on substrate 300, thereby forming OLED film 340.

Figure 4A:
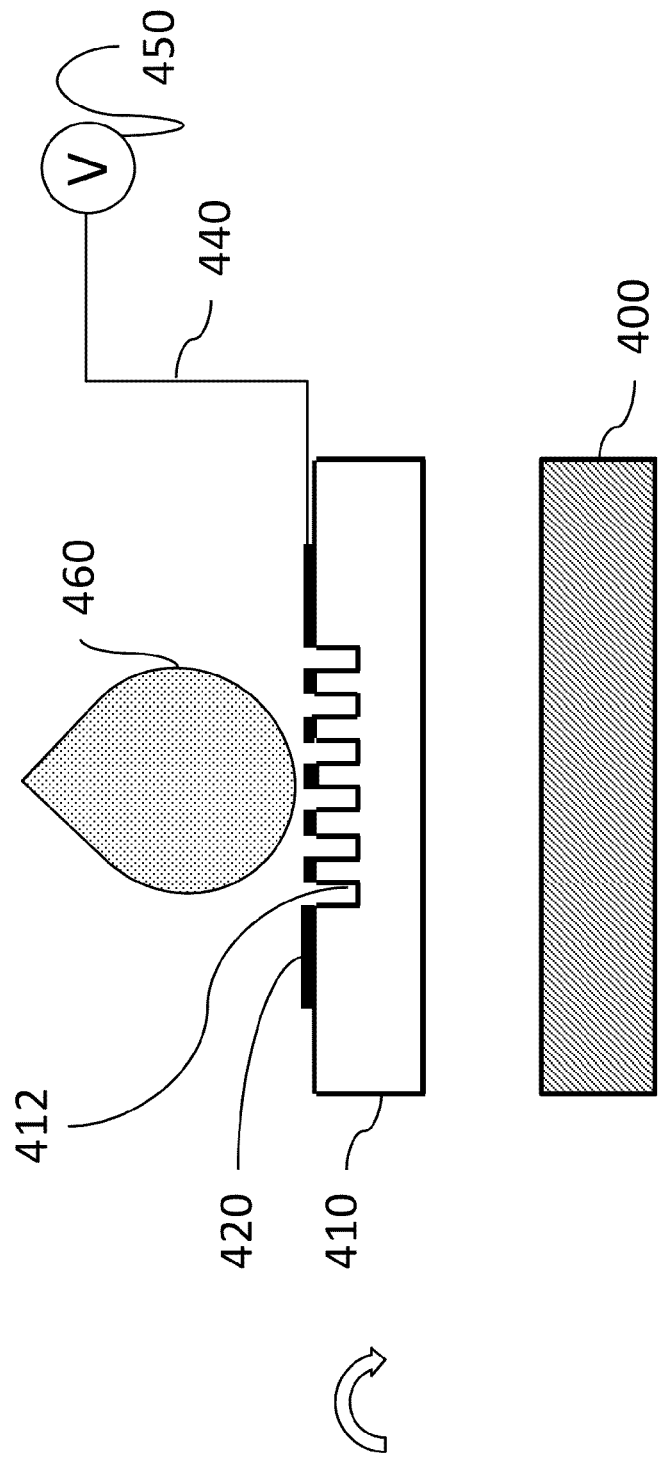
FIG. 4A illustrates a blind OLED printhead.

FIG. 4A illustrates a conventional blind OLED printhead. As compared to the printhead shown in FIG. 3, the blind printhead has micropores that are closed at one end. In FIG. 4A, micropores 412 are formed as blind micropores in printhead 410. Heaters 420 are positioned on the proximal surface of printhead 410. Heaters 420 communicate via wire-bond line 440 with voltage source 450.

Figure 4B:
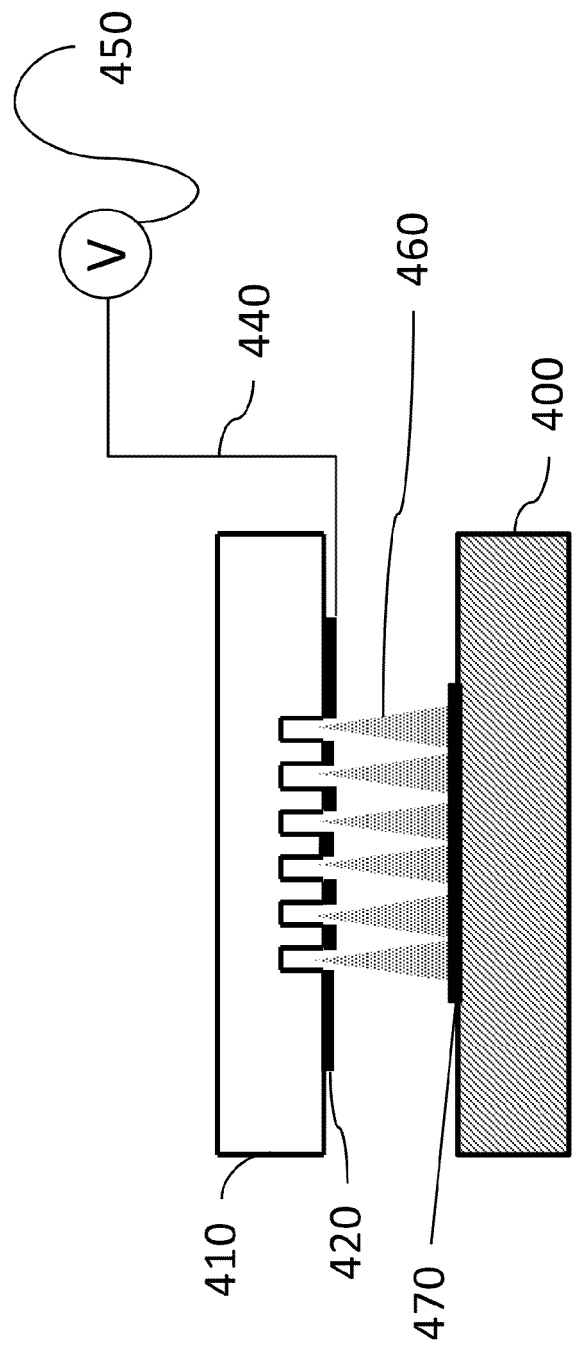
FIG. 4B schematically shows the dispensing process.

In operation, blind pores 412 of printhead 410 receive OLED material 460 which includes a quantity of solid particles suspended and/or dissolved in a carrier liquid. OLED material 460 is drawn into micropores 412 through the capillary action of the micropores. Heaters 420 are then activated and printhead 410 is then rotated about an axis (or positioned relative to the substrate) to face substrate 400 as shown by the arrow. FIG. 4B schematically shows the dispensing process from blind pores of printhead 410. Here, heaters 420 have evaporated the carrier fluid from the OLED material 460. In addition, the solid particles have been substantially evaporated. Upon facing substrate 400, vaporized OLED material 460 dispenses from the blind micropores and condenses on substrate 400 to form OLED film 470.

As stated, optimal manufacturing requires OLED film 470 to have a uniform thickness and sufficient print resolution. OLED material 460 ejects from printhead 410 and spreads laterally as it approaches the substrate. The proximity of printhead 420 to substrate 400 can directly affect the thickness uniformity and resolution of OLED film 470. It is therefore desired to minimize the print gap to distances that are comparable to the edge spreading of acceptable printed features which may be approximately 20-30 micrometers for typical applications. Print gaps of less than 50 micrometers preclude the use of wire-bonds or other protruding features from the distal surface of the printhead.

Figure 5:
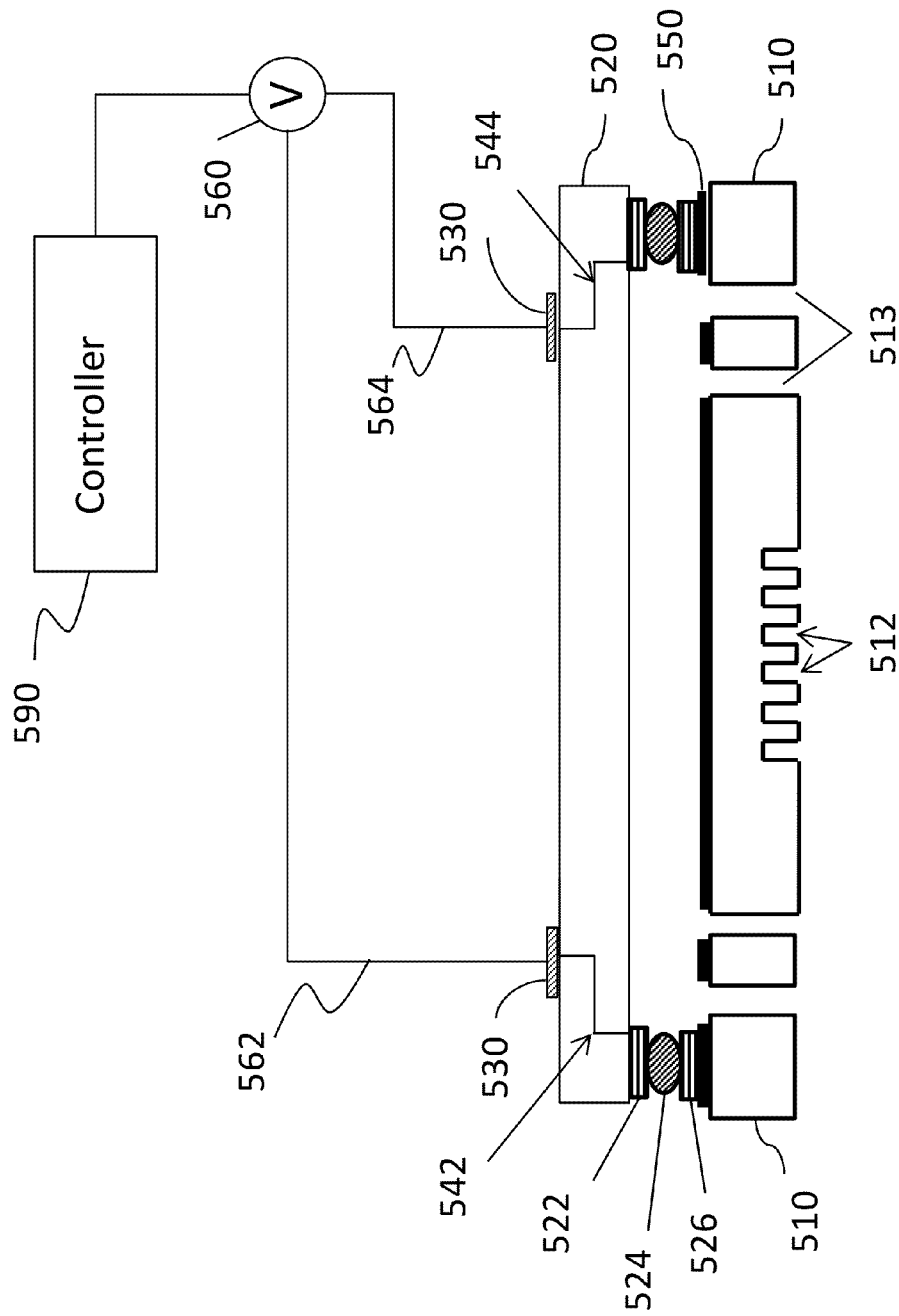
FIG. 5 schematically shows a cross sectional view of an embodiment of the disclosure.

FIG. 5 schematically shows one embodiment of the disclosure. In contrast with a conventional printhead, the embodiment of FIG. 5 defines an integrated device which can be readily assembled (or disassembled) to a large array of printers without having wire-bonds protruding from the printhead surface. Wire-bonds also preclude the printing of OLED material at small gaps as required to attain sufficient feature resolution and thickness uniformity. In FIG. 5, printhead 510 is shown with blind pores 512 on its distal surface. Printhead 510 can be formed from a silicon die. Resistive heaters 550 are connected to the proximal surface of the printhead. Support structure 520 is coupled to the printhead/heaters through a series of interconnects, including, under-bump metal 526, solder bump 524 and package pad 522. The interconnects provide electrical connection between resistive heaters 550 and power supply 560 through connection lines 562 and 564. Support structure 520 can comprise one or more of ceramic or semiconductor material. Support structure 520 includes internal electrical traces 542 and 544 which communicate with connection lines 562 and 564, respectively.

Controller 590 can comprise one or more processor circuits (not shown) and one or more memory circuits (not shown) for controlling voltage source 560. Controller 590 controls heating of one or a plurality of printheads. For this purpose, the memory circuit can contain instructions for the processor to heat the OLED material to substantially remove all of the carrier fluid, and to activate the heater to vaporize and eject solid OLED particles from micropores 512 onto the substrate. In an exemplary embodiment, the memory circuit may also contain instructions to bring the printhead into close proximity with the print substrate. Such instructions can be implemented with the aid of a processor circuit and one or more actuation systems in which one or both of the substrate and/or the printhead are positioned (aligned) relative to each other prior to printing.

Figure 6A:
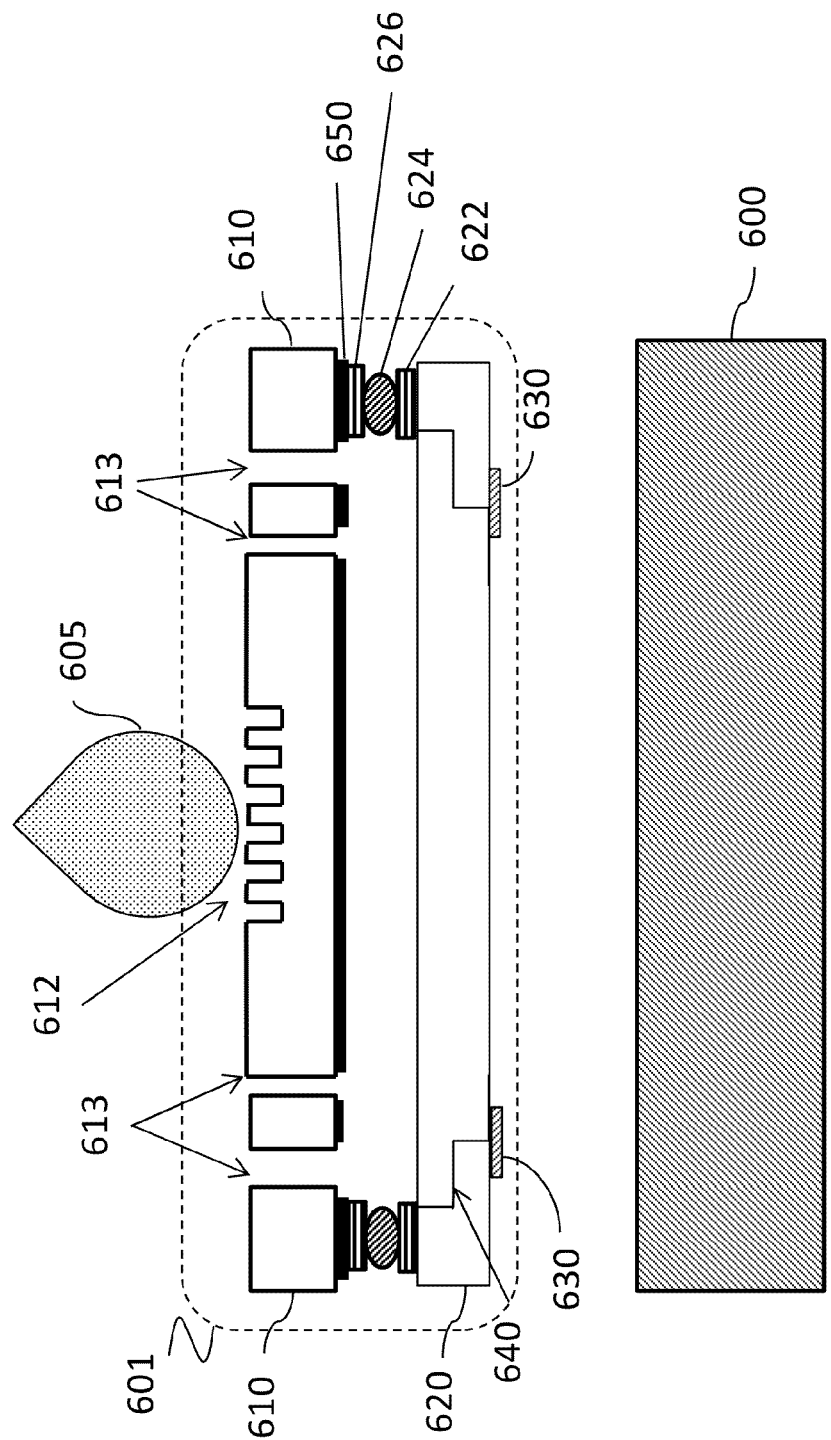
FIGS. 6A and 6B show a printing process according to an embodiment of the disclosure.
Figure 6B:
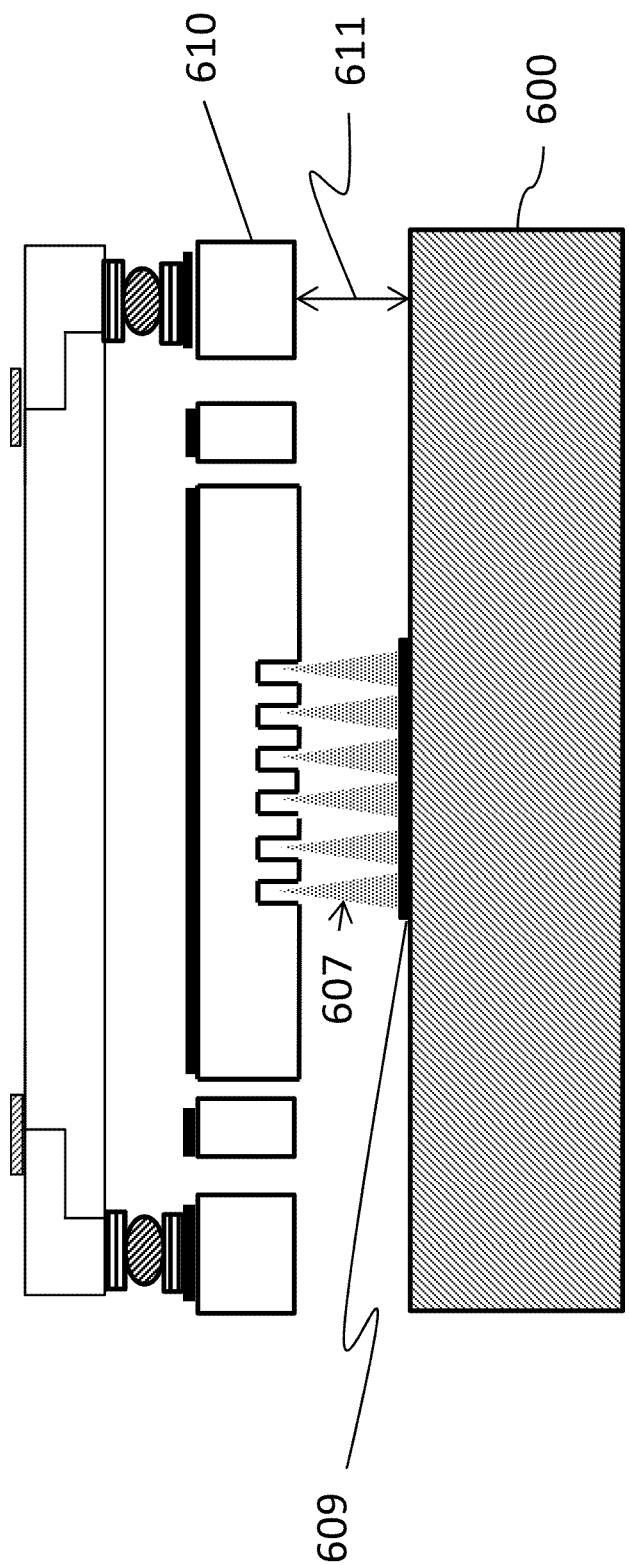

FIGS. 6A and 6B schematically show a printing process according to an embodiment of the disclosure. In FIG. 6A, printhead die 610 is positioned to receive OLED material 605 at micropores 612. OLED material 605 includes solid and dissolved OLED particles in a carrier solution. Integrated system 601 includes printhead die 610, support structure 620, heater 650, UMB metals 626, solder balls 624, package pads 622 and electrical contacts 630. Support structure 620 includes traces 640 for connecting heater 650 to a supply source (not shown) and/or a controller (not shown). Upon receiving OLED material 605, resistive heaters 650 can be activated to evaporate substantially all of the carrier liquid from the distal surface of the printhead.

Gaps 613 are formed in printhead die 610 to form an isolated structure and to reduce the thermal mass of the heated portions of the printhead. Thus, the ink receiving portion of the printhead can be heated quickly and efficiently. It should be noted that gaps 613 appear only in the profile of the structure of FIG. 6. A planar view of the integrated printhead will be discussed below.

UMB metal 626, solder ball 624 and package pad 622 can be made conductive in order to communicate electrical power to resistive heaters 650. In accordance with an embodiment of the disclosure, integrated system 601 defines a solid state system which excludes wire-bonds.

Referring to FIG. 6B, the integrated printhead is now positioned and aligned relative to the substrate such that the distal surface of the printhead is facing substrate 600. In one embodiment of the disclosure, after the alignment, resistive heaters can be used to evaporate any OLED material remaining in the micropores. The evaporated OLED material 607 condenses on substrate 600 to form OLED film 609.

As stated, it is highly desirable to deposit OLED film 607 with uniform thickness and sufficient feature definition. Applicant has discovered that the thickness uniformity and print resolution of the OLED film 607 is directly related to the gap 611 spanning between the distal surface of printhead die 610 and substrate 600. In an embodiment of the disclosure, gap 611 is configured to be less than 30 micron. In a preferred embodiment, the gap is in the range of 25-30 microns. In another preferred embodiment, the gap is less than 20 microns. In an exemplary embodiment, the distal surface of the printhead die defines a flatness tolerance of less than 20 micron. In another exemplary embodiment, the distal tolerance is in the range of 5-10 microns.

Figure 7A:
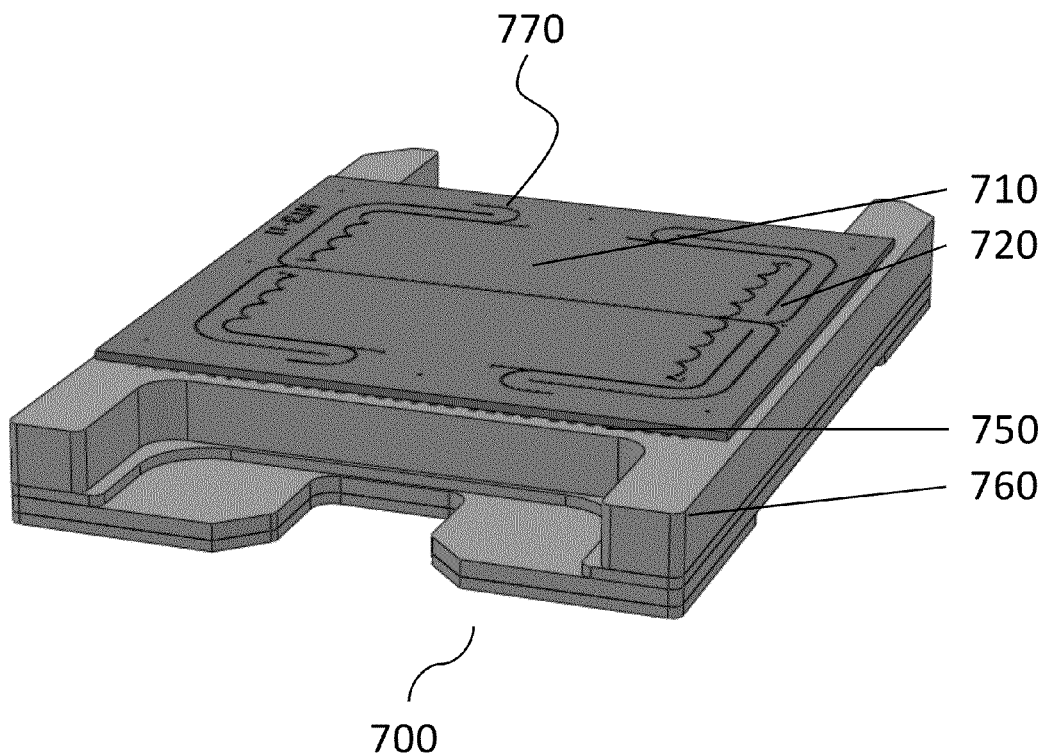
FIG. 7A shows an integrated assembly according to one embodiment of the disclosure.

FIG. 7A shows an integrated assembly according to one embodiment of the disclosure. The integrated assembly 700 includes support structure 760, solder bump joints 750, suspension structure 720 and suspended platform 710. As stated, support structure 760 can be formed from ceramic material.

Insulation trenches 770 are also shown in FIG. 7A, corresponding to the gaps 513 and 613 shown in FIGS. 5 and 6, respectively. The suspended structure 720 enables thermally insulating the micropores in the printhead from the remaining portions of the solid mass.

Figure 7B:
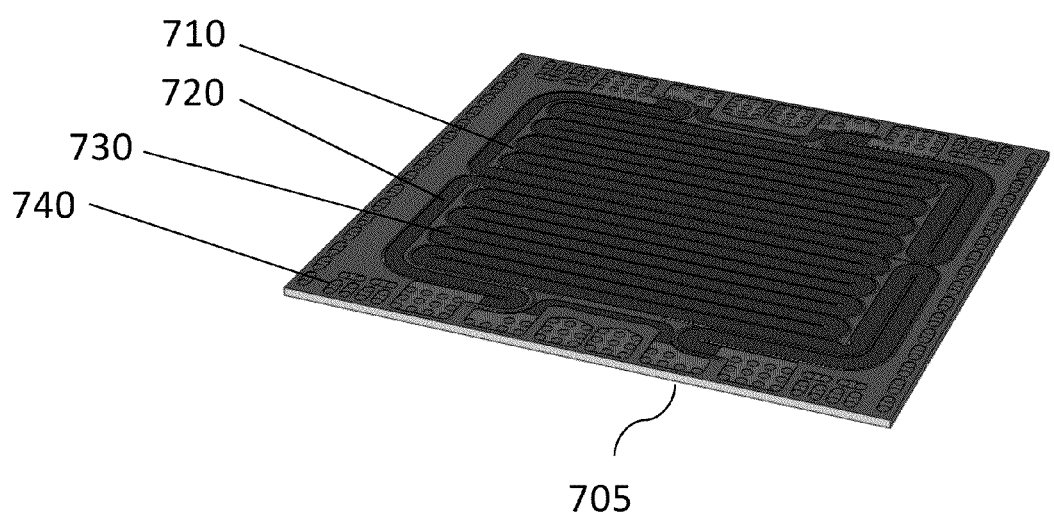
FIG. 7B shows the printhead die according to one embodiment of the disclosure.

FIG. 7B shows the printhead die according to one embodiment of the disclosure. Printhead die 705 shows suspended platform 710, suspension structure 720, heater metal 730, and UBM pad 740. It can be readily seen from FIGS. 7A and 7B that the assembly of printhead die 705 onto a support structure 760 will include coupling the two parts and reflowing solder bump joints 750. Thus, the disclosed embodiment results in a significant manufacturing efficiency.

Figure 8A:
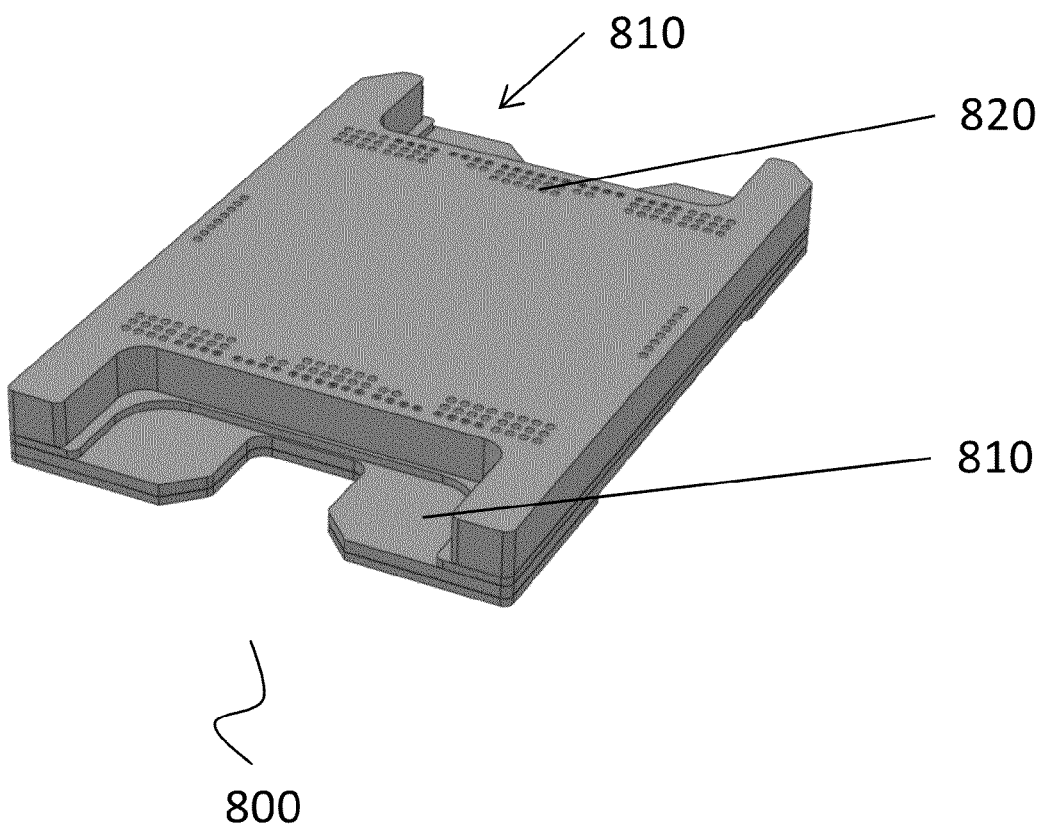
FIG. 8A shows an integrated printhead support structure according to an embodiment of the disclosure.

FIG. 8A shows an integrated printhead support structure according to an embodiment of the disclosure. The integrated printhead support structure 800 is shown with flanges 810 at both ends thereof which provide a retention system. Printhead support structure 800 is also shown with bond pads 820 which can be made from gold, silver or any other electrically conductive material that may be wetted by solder.

Figure 8B:
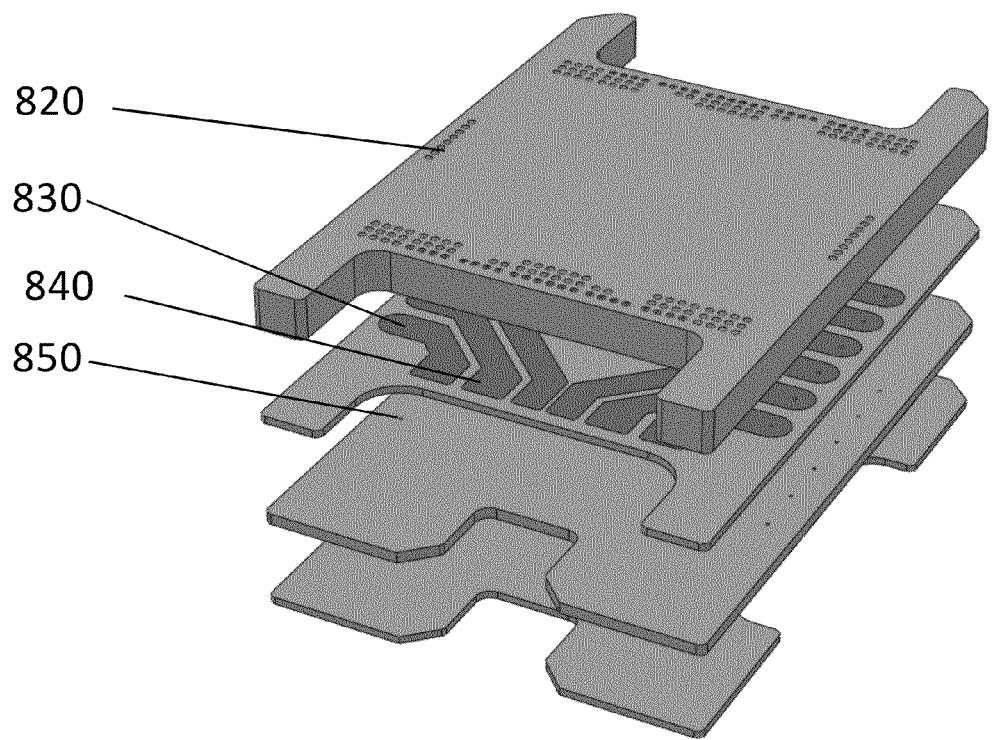
FIG. 8B is an exploded representation of the integrated printhead support structure of FIG. 8A.

FIG. 8B is an exploded representation of the printhead support structure of FIG. 8A. Here, bond pads 820 are shown on the top layer of the integrated printhead assembly, followed by a first set of electric vias 830, internal routing traces 840 and a second set of electric vias 850. As seen from FIGS. 8A and 8B the modular design can provide significant manufacturing efficiency. The layered design can be made with alumina and tungsten electrical traces. In an exemplary embodiment, the layers are screen-printed. Jetted solder balls or electroplated solder can be used for eutectic reflow die attach. In one embodiment, solder balls with an approximate composition of 95 wt. % tin, less than 5 wt. % of silver, and less than 1 wt. % tin were used to provide electrical, thermal and mechanical connections. The solder balls can be designed to provide a separation in a range of about 100-400 µm gap between the printhead and the support structure. In another embodiment, the gap is in a range of about 200-300 µm.

Figure 8C:
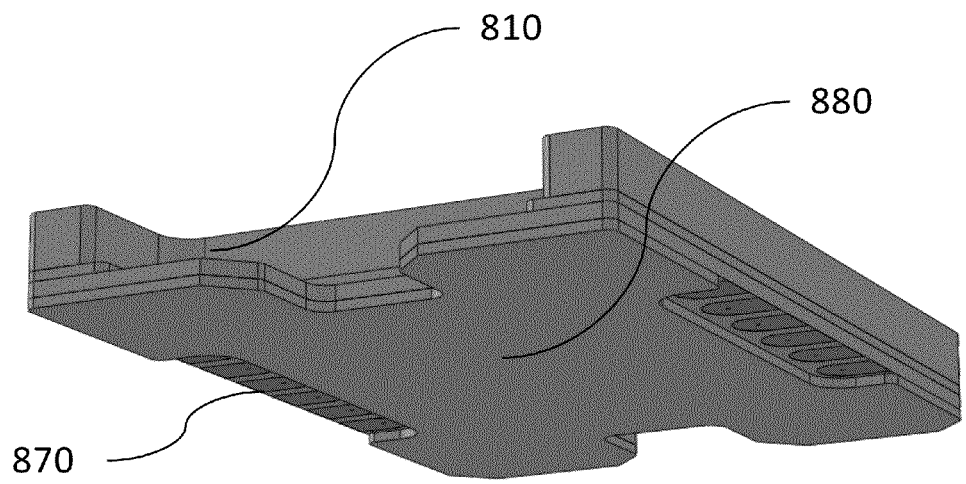
FIG. 8C shows the backside of the integrated printhead assembly of FIG. 8A.

FIG. 8C shows the underside of the support structure shown in FIG. 8A. Specifically, FIG. 8C shows electrical contact pads 870 which allow controller (590, FIG. 5) and/or power supply (560, FIG. 5) to communicate with the printhead. Flange 810 is also shown in FIG. 8. Heat generated by heater 730 is transferred from the integrated printhead to a heat sink through thermal contact area 880.

Figure 9:
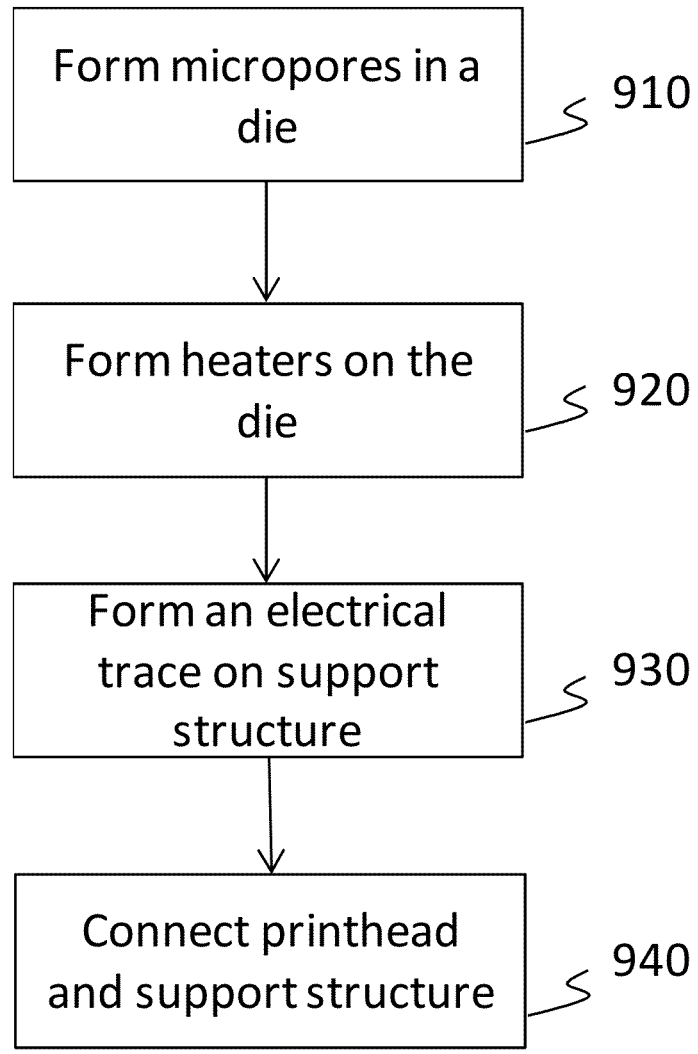
FIG. 9 is an exemplary process for implementing an embodiment of the disclosure.

FIG. 9 is an exemplary process for implementing an embodiment of the disclosure. The process of FIG. 9 starts with step 910 in which one or more micropores are formed in a die. In one embodiment the micropore is a blind micropore. In another embodiment, the micropore defines a cavity which connects the top and the bottom surfaces of the die. In still another embodiment, a series of blind and complete micropores are formed on a silicon die. In step 920, a resistive heater is formed on one or both surfaces of the die. The resistive heater can be made from conventional material. In step 930, a support structure is formed using a ceramic material in which the support structure is configured with electrical traces for communicating with the resistive heater. In step 940, the support structure is coupled to the printhead using one or more connection joints. The connection joints can be formed by providing an under-bump metal on the heater (UBM), depositing a solder bump on the UBM and interposing a package pad between the solder bump and the support structure. When joined, the printhead and the support structure form a solid state, integrated unit without extending wire-bonds In addition, because the printhead provides a solid state unit, there are no wires on the distal end of the printhead; this enables positioning the printhead in an exceptionally close proximity to the substrate, which in turn allows printing significantly improved flat OLED films.

Figure 10A:
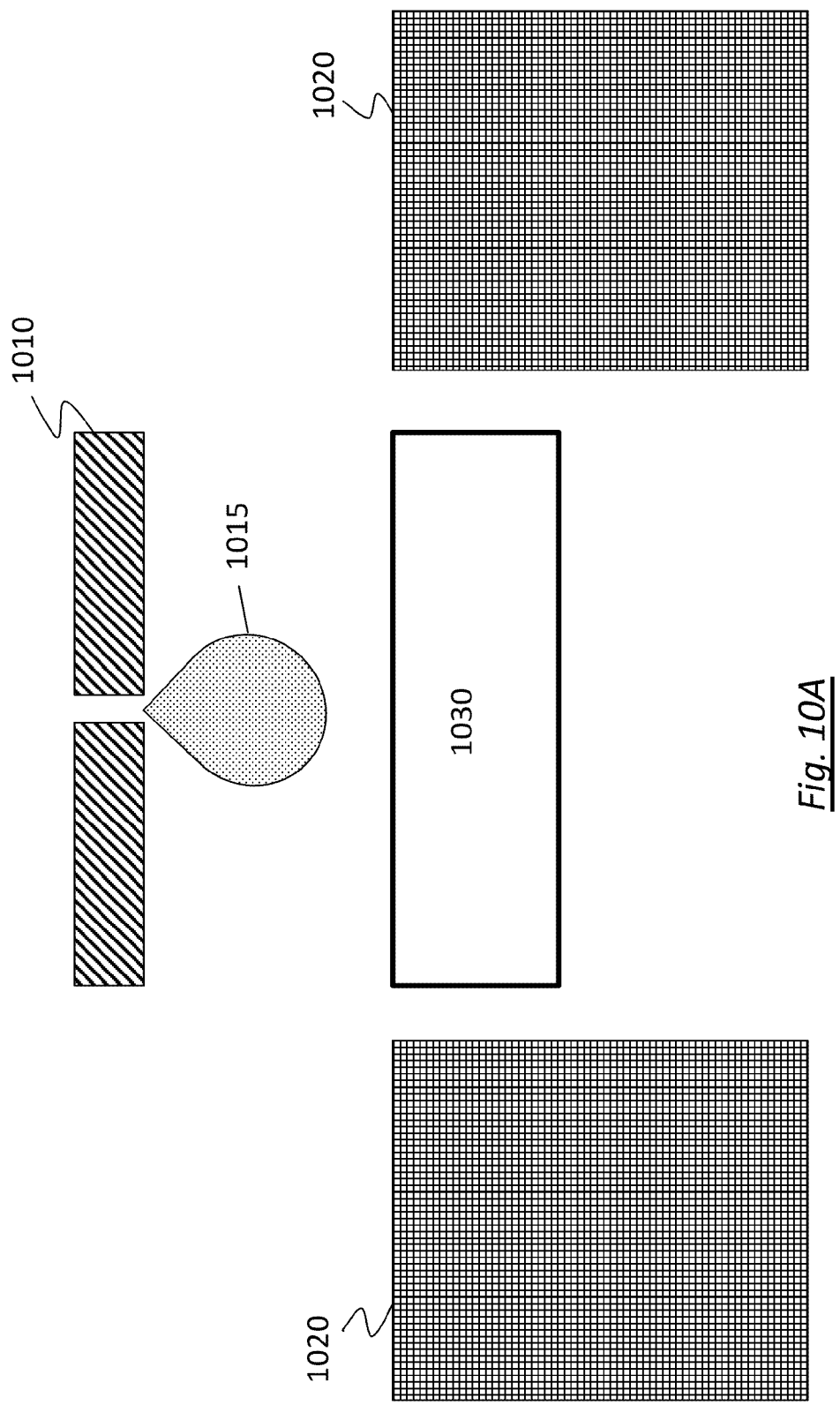
Figure 10C:
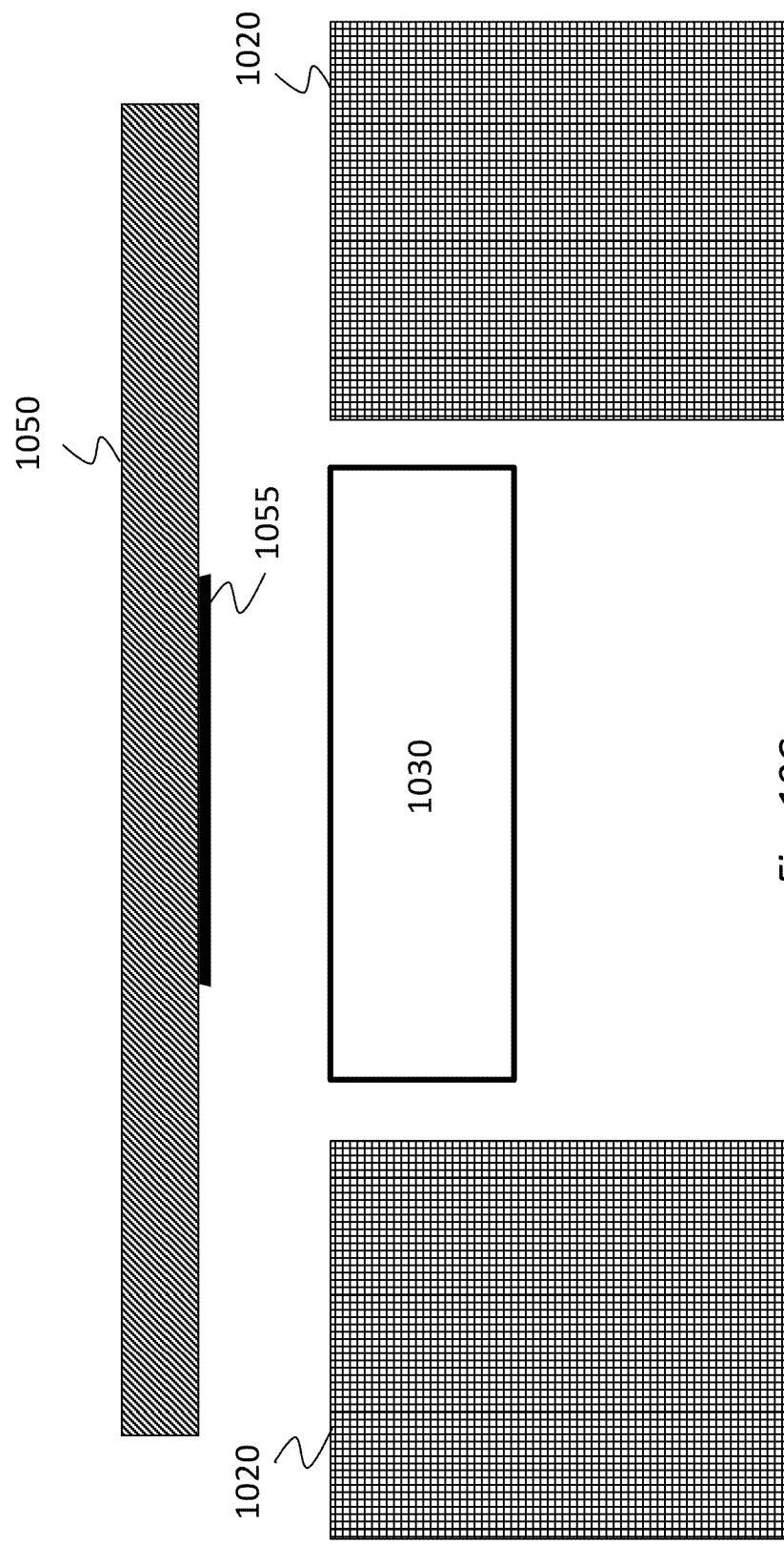

FIGS. 10A-10C schematically represent printing an OLED film according to one embodiment of the disclosure. In FIG. 10A-10C, the printhead is a stationary relative to the OLED supply and the substrate. Referring to FIG. 10A, OLED supply 1010 dispenses OLED droplet 1015 onto a surface of printhead 1030. While not shown, the printhead includes one or more micropores and resistive heaters (including a control circuit) as described above. Printhead 1030 is held stationary by chucks 1020. In FIG. 10B, glass panel substrate 1050 is positioned above the printhead. In addition, the heaters associated with printhead 1030 are activated so as to evaporate substantially all of the carrier liquid contained in OLED droplet 1015 (FIG. 1). In FIG. 10C, resistive heaters cause evaporation of the OLED material from printhead 1030 and its condensation on substrate 1050. During the process shown in FIGS. 10A-10C, printhead 1030 remains stationary while OLED supply 1010 and substrate 1050 are moved and aligned relative to the printhead. Film 1055 which forms on printhead 1050 defines an OLED film with desired thickness and surface topography.

While the principles of the disclosure have been illustrated in relation to the exemplary embodiments shown herein, the principles of the disclosure are not limited thereto and include any modification, variation or permutation thereof.

What is claimed is:

1. An integrated printhead, comprising:
   a printhead die supporting a plurality of micropores thereon;
   a support structure for supporting the printhead die;
   a heater on the printhead die interposed between the printhead die and the support structure; and
   an electrical trace connecting the heater to a supply source;
   wherein the support structure accommodates the electrical trace through a via formed therethrough.

2. The printhead of claim 1, wherein the at least one micropore defines a blind micropore.

3. The printhead of claim 1, wherein the support structure comprises a ceramic material.

4. The printhead of claim 1, wherein the heater is linearly disposed over a proximal surface of the printhead die and the plurality of micropores are disposed on the distal surface of the printhead die.

5. The printhead of claim 4, wherein the distal surface of the printhead define a flatness tolerance of about 5-10 micron.

6. The printhead of claim 1, further comprising a complementary electrical trace connecting the heater to a complementary supply source.

7. The printhead of claim 1, wherein the integrated printhead die defines a device excluding external wiring.

8. The printhead of claim 1, wherein the printhead die further comprises a first trench forming a cavity through the printhead die.

9. The printhead of claim 1, further comprising at least one connection joint for connecting the support structure to at least one heater on the printhead die.

10. The printhead of claim 9, wherein the connection joint comprises at least one of a solder bump, a package pad or an under-bump metal (UMB).

11. A printhead for printing OLED on a substrate, comprising:
    a printhead die having a proximal surface and a distal surface, the distal surface defining a plurality of micropores;
    a heater in thermal communication with the proximal surface of the printhead die; and
    a support structure for supporting the printhead die, the support structure providing a trace for connecting the heater to a supply source;
    wherein the printhead die in combination with the heater and the support structure form a solid state printhead, and wherein the distal surface of the printhead die defines a flatness tolerance of less than 20 micron.

12. The printhead of claim 11, wherein the printhead die defines a flatness tolerance of less than 10 micron.

13. The printhead of claim 11, wherein the printhead die has defines a flatness tolerance in a range of about 5-10 micron.

14. The printhead of claim 11, wherein at least one of the plurality of micropore define blind micropore.

15. The printhead of claim 11, wherein the support structure comprises a ceramic material.

16. The printhead of claim 11, the trace comprises a connection for connecting the heater to the supply source.

17. The printhead of claim 11, wherein the printhead die further comprises a first trench forming a cavity through the printhead die.

18. The printhead of claim 11, further comprising a connection joint for connecting the support structure to the heater.

19. The printhead of claim 18, wherein the connection joint comprises at least one of a solder bump, a package pad or an under-bump metal (UMB).

20. The printhead of claim 18, wherein the connection joint receives the trace.

21. The printhead of claim 11, wherein the printhead is positioned not more than about 40 microns from the substrate at printing.

* * * * *